US011846857B2

(12) United States Patent
Yang et al.

(10) Patent No.: US 11,846,857 B2
(45) Date of Patent: Dec. 19, 2023

(54) ARRAY SUBSTRATE AND DISPLAY PANEL

(71) Applicant: TCL China Star Optoelectronics Technology Co., Ltd., Guangdong (CN)

(72) Inventors: Litao Yang, Guangdong (CN); Xing Ouyang, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 240 days.

(21) Appl. No.: 17/417,870

(22) PCT Filed: May 28, 2021

(86) PCT No.: PCT/CN2021/096931
§ 371 (c)(1),
(2) Date: Jun. 24, 2021

(87) PCT Pub. No.: WO2022/147949
PCT Pub. Date: Jul. 14, 2022

(65) Prior Publication Data
US 2023/0161207 A1    May 25, 2023

(30) Foreign Application Priority Data
Jan. 7, 2021  (CN) ......................... 2021100160863.7

(51) Int. Cl.
| G02F 1/1362 | (2006.01) |
| G02F 1/1368 | (2006.01) |
| H01L 27/12 | (2006.01) |

(52) U.S. Cl.
CPC ...... *G02F 1/136286* (2013.01); *G02F 1/1368* (2013.01); *H01L 27/124* (2013.01)

(58) Field of Classification Search
CPC .................................................... G02F 1/1362
See application file for complete search history.

(56) References Cited

U.S. PATENT DOCUMENTS

2006/0262239 A1* 11/2006 Oana ................. H01L 29/41733
257/E27.111

FOREIGN PATENT DOCUMENTS

| CN | 1870296 |   | 11/2006 |   |
| CN | 101174651 |   | 5/2008 |   |
| CN | 102566178 |   | 7/2012 |   |
| CN | 105242463 | * | 1/2016 | ........... G02F 1/1343 |
| CN | 105870197 |   | 8/2016 |   |
| CN | 112835233 |   | 5/2021 |   |

* cited by examiner

*Primary Examiner* — Sang V Nguyen

(57) ABSTRACT

An array substrate and a display panel are provided. By arranging a drain and a connection hole in a range defined by two branch portions of a source, an area occupied by the drain is reduced, and the defective problems of bright spots or vertical lines displayed on the display panel due to a short circuit of the drain and data lines can be avoided.

18 Claims, 4 Drawing Sheets

ARRAY SUBSTRATE AND DISPLAY PANEL

RELATED APPLICATIONS

This application is a National Phase of PCT Patent Application No. PCT/CN2021/096931 having International filing date of May 28, 2021, which claims the benefit of priority of Chinese Patent Application No. 202110016086.7 filed on Jan. 7, 2021. The contents of the above applications are all incorporated by reference as if fully set forth herein in their entirety.

FIELD AND BACKGROUND OF THE INVENTION

The present disclosure relates to the technical field of display, and particularly, to an array substrate and a display panel.

Liquid crystal display panels are widely used due to the advantages such as wide view angles, high brightness, high contrast, low energy consumption, and thin volume. Active thin film transistor-liquid crystal displays (TFT-LCD) have been rapidly developed and widely used in recent years. Most of the conventional liquid crystal display panels on the market are backlight liquid crystal display panels, which comprise liquid crystal display panels and backlight modules. Generally, a liquid crystal display panel is constituted of a color filter (CF) substrate, an array substrate (thin film transistor array substrate, TFT array substrate), a liquid crystal (LC) sandwiched between the color filter substrate and the array substrate, and a sealing frame. The working principle is to control the rotation of liquid crystal molecules of a liquid crystal layer by applying a driving voltage onto two glass substrates, and refract a light emitted from the backlight module to produce a picture.

An array substrate 10 of a conventional liquid crystal display panel is shown in FIG. 1. The array substrate 10 comprises scan lines 11, data lines 12 intersecting the scan lines 11, and sub-pixel units 17 defined by the scan lines 11 and the data lines 12. Each of the sub-pixel unit 17 comprises a thin film transistor 13 and a pixel electrode 14. The thin film transistor 13 comprises a source 131, a gate 132, and a drain 133. The source 131 is connected to the data lines 12 via an extension portion 16 of the data lines 12. The gate 132 is connected to one of the scan lines 11. One end of the drain 133 is connected to the pixel electrode 14 through a connection hole 15. The source 131 is constituted of two branch portions (131a, 131b), which are in a semicircular arc shape. Another end of the drain 133 away from the pixel electrode 14 extends into a space formed by the semicircular arc shape.

However, in such conventional structure, when metal residues or foreign objects are present in the sub-pixel unit 17, the drain 133 is easily connected to the data lines 12, so that the drain 133 and the data line 12 are short-circuited, resulting in bright spots or defective vertical lines appearing on the display panel.

Technical Problems

The embodiments of the present disclosure provide an array substrate and a display panel. The object is to improve a problem that a drain and data lines in a conventional display panel are prone to short circuit, which causes the display panel to have the problems of bright spots or defective vertical line.

SUMMARY OF THE INVENTION

The embodiments of the present disclosure provide an array substrate, comprising:
scan lines;
data lines intersecting the scan lines; and
sub-pixel units defined by intersections of the scan lines and the data lines. Each of the sub-pixel units comprises a thin film transistor and a pixel electrode. The thin film transistor comprises a gate connected to one of the scan lines, a source connected to one of the data lines, and a drain connected to the pixel electrode.

In a direction parallel to a plane of the array substrate, the source comprises two branch portions located in each of the sub-pixel units. The drain is connected to the pixel electrode through a connection hole, and the drain and the connection hole are disposed inside a range defined by the two branch portions.

In some embodiments, one or more connection portions extend from each of the data lines, and each of the data lines is connected to the two branch portions through the one or more connection portions.

In some embodiments, a shape of each of the connection portions is a strip shape.

In some embodiments, the two branch portions are directly connected to the data lines.

In some embodiments, endpoints of the two branch portions are connected to each other to form a closed ring shape. The drain and the connection hole are disposed inside the ring shape. The ring shape may be a circular ring or an elliptical ring.

In some embodiments, the drain and the connection hole are disposed at a center of the ring.

In some embodiments, the drain is in a round shape or a rectangular shape.

In some embodiments, endpoints of the two branch portions are not connected to each other to form a semicircular arc shape with an opening. The drain and the connection hole are disposed inside the opening of the semicircular arc shape.

In some embodiments, the opening of the semicircular arc shape faces toward a direction parallel to a direction that the scan lines extend.

In some embodiments, projections of the drain and the connection hole projected on the array substrate are located within a projection range of the gate projected on the array substrate.

In some embodiments, the gate is formed by a widened portion of the scan lines in the sub-pixel units.

In some embodiments, the thin film transistor further comprises an active layer. In a direction perpendicular to the plane of the array substrate, the active layer is disposed on the gate, and the drain and the source are disposed on the active layer.

In some embodiments, the pixel electrode is made of indium tin oxide or indium zinc oxide.

The embodiments of the present the present disclosure further provide a display panel. The display panel comprises the array substrate provided by any one of the embodiments mentioned above.

Beneficial Effects

In the array substrate provided by the present disclosure, by disposing a drain and a connection hole inside a range defined by two branch portions of a source, an area occupied by the drain is reduced, and the problems of bright spots or defective vertical lines displayed on the display panel due to a short circuit of the drain and data lines may be avoided, thereby enhancing a display quality of the display panel.

BRIEF DESCRIPTION OF THE SEVERAL
VIEWS OF THE DRAWINGS

Figure 1:
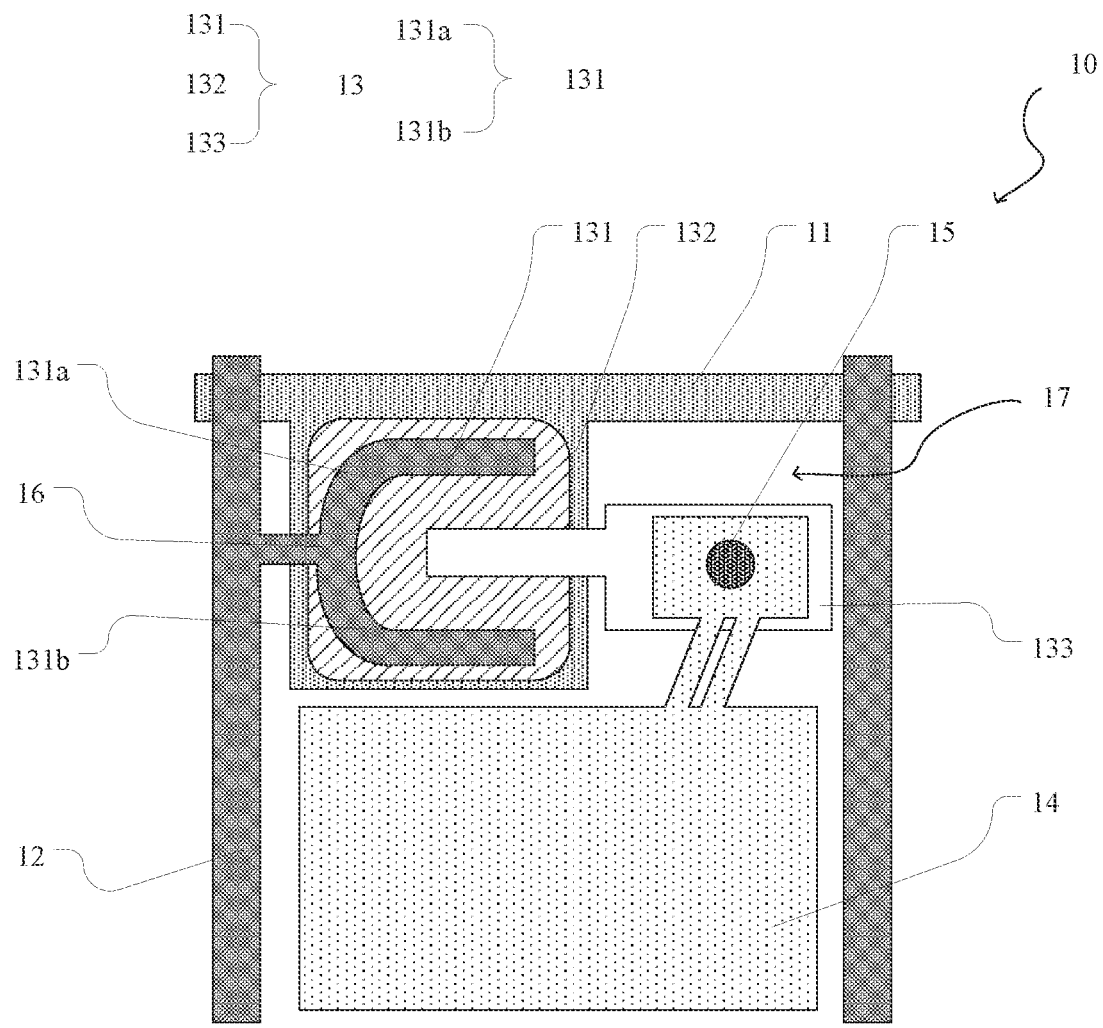
FIG. 1 is a partial schematic structural view of an array substrate in the prior art.

The symbols in the drawings are explained in the follows: 10, 20: array substrate; 11, 21: scan lines; 12, 22: data lines; 13, 23: thin film transistor; 14, 24: pixel electrode; 131, 231: source; 132, 232: gate; 133, 233: drain; 234: active layer; 15, 25: connection hole; 16, 26: connection portion; 17, 27: sub-pixel unit; 131a, 131b, 231a, 231b: branch portions.

DESCRIPTION OF THE SPECIFIC
EMBODIMENTS OF THE INVENTION

The following will clearly and completely describe the technical solutions in the embodiments of the present disclosure with reference to the drawings in the embodiments of the present disclosure. Obviously, the described embodiments are only one portion of the embodiments of the present disclosure, rather than all of the embodiments. Based on the embodiments in the present disclosure, all other embodiments obtained by those skilled in the art without creative work are within claimed scope of the present disclosure.

In the description of the present disclosure, it should be understood that the orientation or positional relationship of the terms "center", "longitudinal", "lateral", "length", "width", "thickness", "above", "below", "front", "back", "left", "right", "vertical", "horizontal", "top", "bottom", "inner", "outer", "clockwise", "counterclockwise", etc. are based on the orientation or positional relationship shown in the drawings. It is only for the convenience of describing the present disclosure and simplifying the description and does not indicate or imply that the device or element referred to must have a specific orientation, be constructed and operated in a specific orientation, and therefore cannot be understood as a limitation of the present disclosure. It should be noted that, unless otherwise clearly specified and limited, the terms "installation", "connecting", and "connection" should be understood in a broad sense. For example, it may be a fixed connection, a detachable connection, or an integral connection. It may be mechanically connected, or electrically connected, or may communicate with each other. It may be directly connected, or indirectly connected through an intermediate medium. It may be an internal communication between two components or an interaction relationship between the two components. For those of ordinary skill in the art, the specific meaning of the above terms in the present disclosure can be understood according to the specific situation.

In the present disclosure, unless clearly stipulated and defined otherwise, a first feature "above" or "below" a second feature may comprise direct contact between the first feature and second feature or may also comprise indirect contact between the first feature and second feature but through other features between them. Moreover, the first feature "above", "on", and "over" the second feature comprise the first feature directly above and obliquely above the second feature, or it simply means that a level of the first feature is higher than a level of the second feature. The first feature "below", "beneath" and "under" of the second feature comprise the first feature directly below and obliquely below the second feature, or it simply means that the level of the first feature is lower than the level of the second feature.

Figure 2:
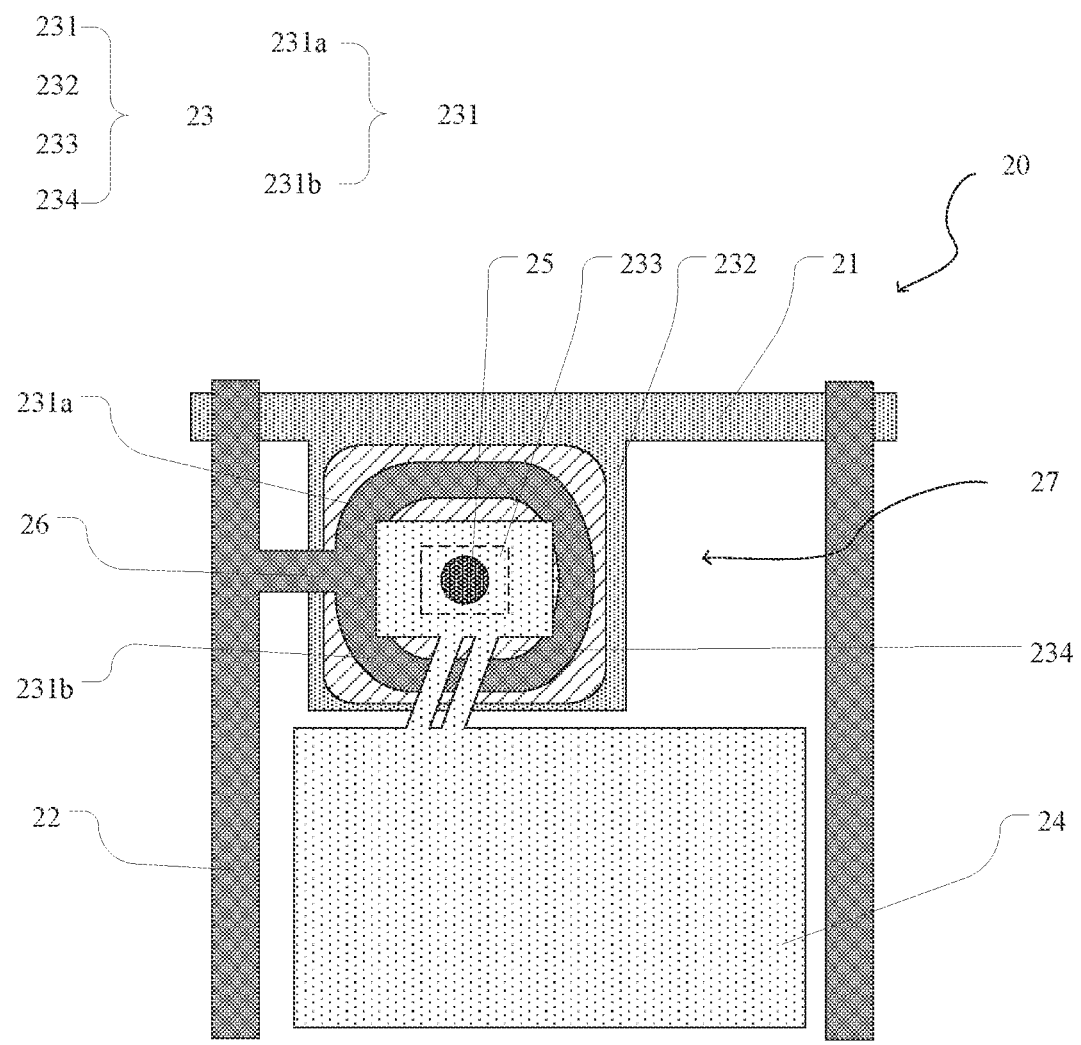
FIG. 2 is a partial schematic structural view of an array substrate in one embodiment of the present disclosure.
Figure 3:
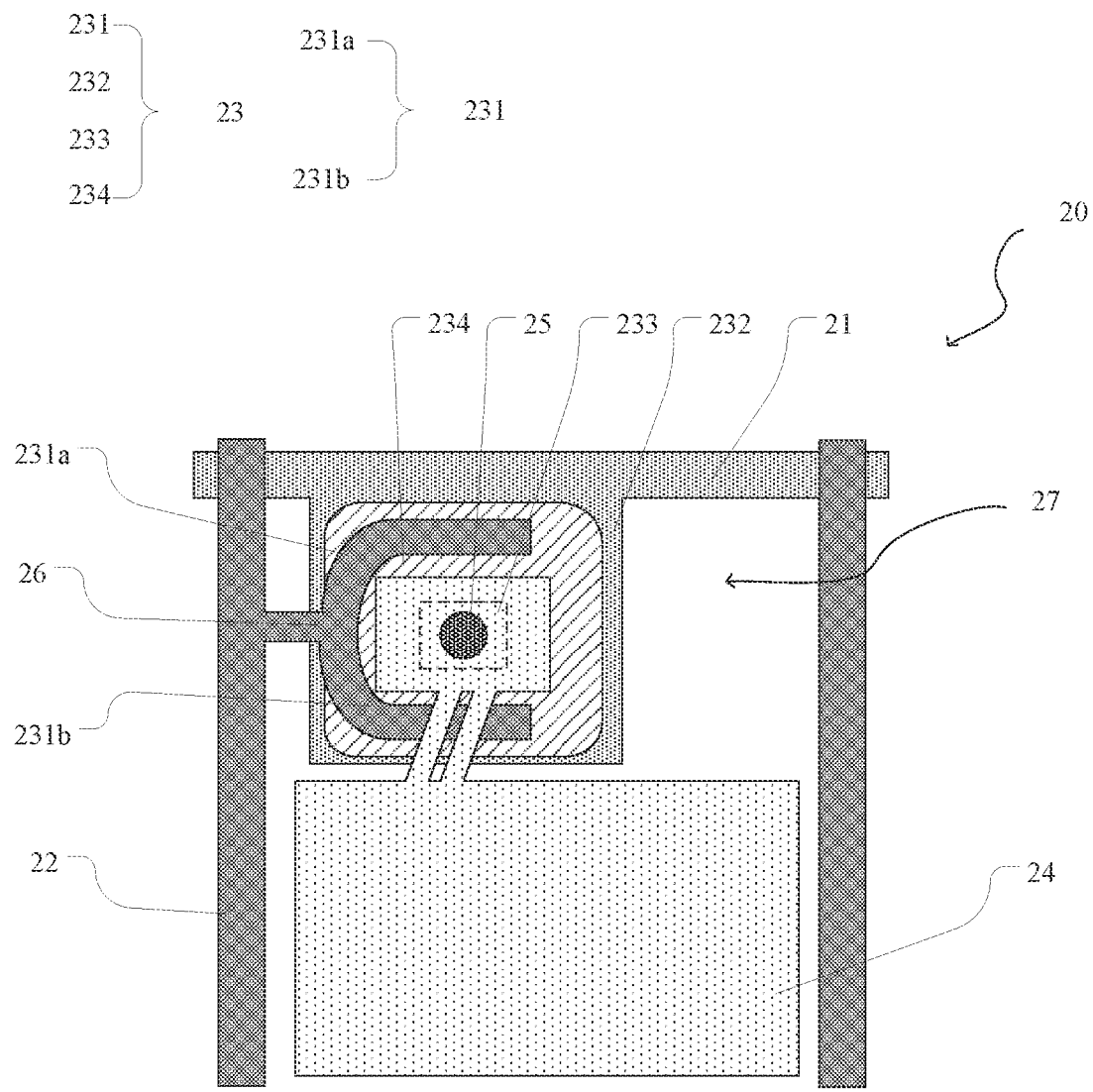
FIG. 3 is a partial schematic structural view of an array substrate in another embodiment of the present disclosure.
Figure 4:
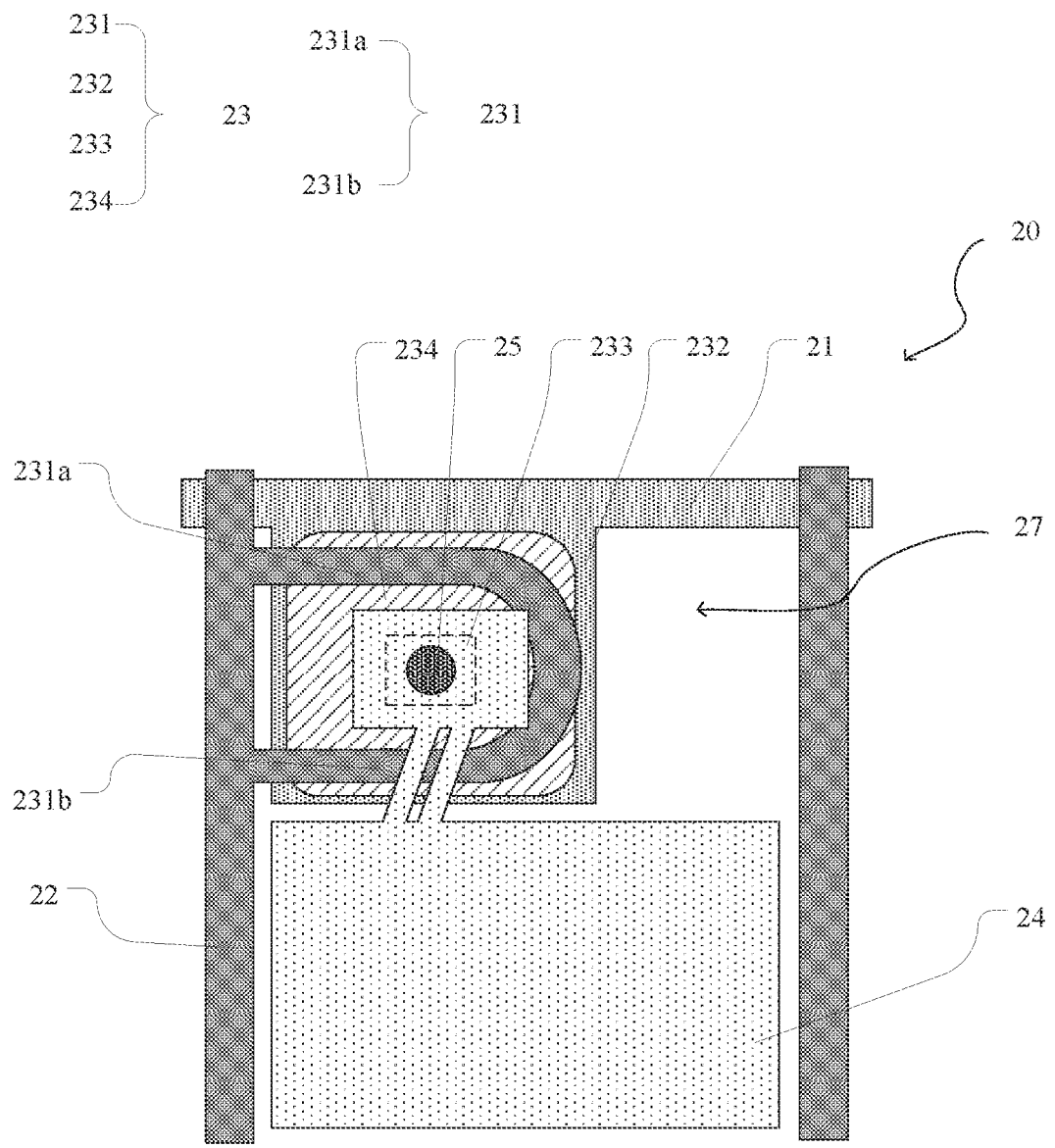
FIG. 4 is a partial schematic structural view of an array substrate in yet another embodiment of the present disclosure.

First, please refer to FIG. 2 to FIG. 4, an embodiment of the present disclosure provides an array substrate 20. The array substrate 20 comprises scan lines 21, data lines 22 intersecting the scan lines 21, and sub-pixel units 27. Each of the sub-pixel unit 27 comprises a thin film transistor 23 and a pixel electrode 24.

The scan lines 21 are arranged in parallel along a first direction. The data lines 22 are arranged in parallel along a second direction. Each of the sub-pixel units 27 is defined by intersections of the scan lines 21 and the data lines 22, so that the sub-pixel units 27 are arranged in an array.

Specifically, the thin film transistor 23 comprises a gate 232 connected to one of the scan lines 21, a source 231 connected to the data lines 22, and a drain 233 connected to the pixel electrode 24.

In a direction parallel to a plane of the array substrate 20, the source 231 comprises two branch portions (231a, 231b) located in each of the sub-pixel units 27. The drain 233 is connected to the pixel electrode 24 through a connection hole 25, and the drain 233 and the connection hole 25 are disposed inside a range defined by the two branch portions (231a, 231b).

In the array substrate 20 provided by the present disclosure, by disposing the drain 233 and the connection hole 25 inside a range defined by two branch portions (231a, 231b) of the source 231, an area occupied by the drain 233 is reduced, and the problems of bright spots or defective vertical lines displayed on the display panel due to a short circuit of the drain 233 and data lines 22 may be avoided, thereby enhancing a display quality of the display panel.

In some embodiments, as shown in FIG. 2 and FIG. 3, one connection portion 26 extend from each of the data lines 22. Each of the data lines 22 is connected to the two branch portions (231a, 231b) of the source 231 through the connection portion 26.

In some embodiments, a shape of the connection portion 26 is a strip shape. It should be noted that a number of the connection portion 26 may be one. As shown in FIG. 2 and FIG. 3, one end of the strip-shaped connection portion 26 is connected to the data lines 22, and another end of the strip-shaped connection portion 26 is connected to the two branch portions (231a, 231b) of the source 231. A number of the connection portion 26 may also be multiple, such as two. One end of each of the two strip-shaped connection portions 26 is connected to the data lines 22, and another end of each of the two strip-shaped connection portions 26 is respectively connected to the two branch portions (231a, 231b) of the source 231.

The present disclosure further provides an embodiment. The difference between the present embodiment and the above-mentioned embodiment is that the two branch portions (231a, 231b) of the source 231 may also be directly connected to the data lines 22 without through the connection portion 26.

As shown in FIG. 4, the two branch portions (231a, 231b) of the source 231 are directly connected to the data lines 22, and two corresponding connection points of the two branch portions (231a, 231b) of the source 231 on the data lines 22 are separated by a distance. Endpoints of the two branch portions (231a, 231b) of the source 231 away from the data lines 22 are connected to each other, so that the two branch portions (231a, 231b) of the source 231 are in a semicircular arc shape.

In some embodiments, endpoints of the two branch portions (231a, 231b) of the source 231 away from the data lines 22 are not connected to each other.

For example, as shown in FIG. 3, endpoints of the two branch portions (231a, 231b) of the source 231 may extend in opposite directions, so that the two branch portions (231a, 231b) of the source 231 are in a semicircular arc shape with an opening. The drain 233 and the connection hole 25 are disposed inside the opening of the semicircular arc shape. The opening of the semicircular arc shape faces toward a direction parallel to a direction that the scan lines 31 extend. It should be noted that a direction which the opening of the semicircular arc shape is toward may also be perpendicular to a direction that the scan lines 21 extend, or be oblique at a certain angle, as long as the drain 233 and the connection hole 25 may be disposed inside the opening of the semicircular arc shape, which is not specifically limited herein.

For another example, endpoints of the two branch portions (231a, 231b) of the source 231 away from the data lines 22 may extend in opposite directions, so that the two branch portions (231a, 231b) of the source 231 are in a ring shape with a gap. The drain 233 and the connection hole 25 are disposed within the gap of the ring shape.

In one embodiment, as shown in FIG. 2, endpoints of the two branch portions (231a, 231b) of the source 231 may extend in opposite directions, and the two branch portions (231a, 231b) of the source 231 are connected to each other, so that the two branch portions (231a, 231b) of the source 231 are in a closed ring shape. The drain 233 and the connection hole 25 are disposed within the ring shape. In one embodiment, the drain 233 and the connection hole 25 are disposed at a center of the ring, so that the performance of the thin film transistor 23 is more stable.

The ring shape may be a circular ring or an elliptical ring, and may also be a square ring, a trapezoidal ring, or a triangular ring. It may be understood that as long as endpoints of the two branch portions (231a, 231b) are connected to each other, allowing the two branch portions (231a, 231b) to form a closed shape, which is not specifically limited herein.

The thin film transistor 23 further comprises an active layer 234. In a direction perpendicular to a plane of the array substrate 20, the active layer 234 is disposed on the gate 232. The drain 233 and the source 231 are disposed on the active layer 234 in a same layer. The active layer 234 comprises a conductive channel between the source 231 and the drain 233.

Specifically, a material of the active layer 234 may comprise amorphous silicon (a-Si), and may also comprise polysilicon or metal oxide semiconductor. For example, the polysilicon may be a high-temperature polysilicon or a low-temperature polysilicon. The oxide semiconductor may be indium gallium zinc oxide (IGZO), indium zinc oxide (IZO), zinc oxide (ZnO), or gallium zinc oxide (GZO), etc.

In the array substrate 20 provided by the embodiment of the present disclosure, by disposing the ring-shaped conductive channel in the thin film transistor 23, compared with the prior art, a length of the conductive channel in the thin film transistor 23 designed by the embodiment of the present disclosure is longer, so that the conduction effect of the thin film transistor 23 is better.

On the basis of the above-mentioned embodiment, the present disclosure further provides one embodiment. In a direction parallel to a plane of an array substrate 20, a drain 233 is in a circular shape or a rectangular shape. In one embodiment, an outline of the shape of the drain 233 is consistent with or close to an outline of a shape of two branch portions (231a, 231b) of the source 231. For example, when the two branch portions (231a, 231b) of the source 231 form a closed ring, the drain 233 is in the circular shape. When the drain 233 forms a closed elliptical ring shape or a rectangular ring shape, the drain 233 is in the rectangular shape. With such a shape design, a channel width distribution in the thin film transistor 23 is uniform, so that the performance of the thin film transistor 23 is more stable.

In some embodiments, a material of the pixel electrode 24 may comprise indium tin oxide or indium zinc oxide.

In some embodiments, a material of the connection hole may comprise a transparent conductive material, such as indium tin oxide (ITO), indium zinc oxide (IZO), indium gallium oxide (IGO), gallium zinc oxide (GZO), or carbon nanotubes.

In some embodiments, a material of the gate 232 may comprise a copper-based metal, an aluminum-based metal, a nickel-based metal, etc. For example, the copper-based metal is copper (Cu), or other copper-based metal alloys with stable properties, such as copper-zinc alloy (CuZn), copper-nickel alloy (CuNi), or copper-zinc-nickel alloy (CuZnNi).

In some embodiments, the thin film transistor 23 further comprises a gate insulation layer. In a direction perpendicular to the plane of the array substrate 20, the gate insulation layer is disposed between the gate 232 and the active layer 234.

A material of the gate insulation layer may comprise silicon nitride (SiNx), silicon oxide (SiOx), silicon oxynitride (SiNxOy), or other suitable materials, such as organic resin materials.

A switching principle of the thin film transistor 23 is specifically as follows: when a positive voltage is applied to the gate 232, electrons in the active layer 234 are attracted to a surface of the gate insulation layer to form a conductive channel. The source 231 and the drain 233 are conductive, and the thin film transistor 23 is turned on. When a negative voltage is applied to the gate 232, the active layer 234 is filled with holes, and the electrons may not pass from the source 231 to the drain 233, and then the thin film transistor 23 is turned off.

In some embodiments, the thin film transistor 23 further comprises a passivation layer. The passivation layer is disposed on the active layer 234, the source 231, and the gate 232. The passivation layer may cover the entire thin film transistor 23 to provide protection.

A material of the passivation layer may comprise silicon oxide (SiOx), silicon nitride (SiNx), silicon oxynitride (SiOxNy), or other suitable materials. For example, the passivation layer may be a single-layer structure constituted of silicon nitride or silicon oxide, or a multi-layer structure constituted of silicon nitride and silicon oxide.

In some embodiments, a projection of the drain 233 and the connection hole 25 projected on the array substrate 20 is located within a projection range of the gate 232 projected on the array substrate 20.

In some embodiments, the gate 232 is formed by a widened portion of the scan lines 21 in the sub-pixel units 27.

It should be noted that the above-mentioned embodiment of the array substrate 20 merely describes the above-mentioned structure. It is understood that in addition to the above-mentioned structure, the array substrate 20 of the embodiment of the present disclosure may further comprises any other essential structures. For example, the array substrate 20 may further comprise a substrate buffer layer under the scan lines 21, the data lines 22, and the sub-pixel units 27, which is the same as the prior art, and is omitted herein.

Based on the same concept as the present disclosure, one embodiment of the present disclosure provides a display panel. The display panel comprises the array substrate 20 described in any one of the above-mentioned embodiments. The display panel may be any product or component with a display function, such as a television, a digital camera, a mobile phone, a watch, a tablet computer, a notebook computer, or a navigator.

For example, an example of the display panel is a liquid crystal display panel. The liquid crystal display panel comprises an array substrate 20 and an opposite substrate. The array substrate 20 and the opposite substrate are opposed to each other to form a liquid crystal cell. The liquid crystal cell is filled with liquid crystal materials. For example, the opposite substrate is a color filter substrate. A pixel electrode 24 of each of sub-pixel units 27 of the array substrate 20 is used to apply an electric field to control the rotation of the liquid crystal materials and to perform a display operation. Generally, the liquid crystal display panel comprises a backlight source. For example, the backlight source is disposed on a rear side of the array substrate 20 with respect to the opposite substrate.

Another example of the display panel is an organic light-emitting diode (OLED) display panel. The organic light-emitting diode is formed on the array substrate 20. The pixel electrode 24 of each of the sub-pixel units 27 may be used as an anode or a cathode of the organic light-emitting diode, or may be electrically connected to the anode or the cathode of the organic light-emitting diode for driving the organic light-emitting diode to emit light to perform a display operation.

Another example of the display panel is an electronic paper display panel. An electronic ink layer is formed on the array substrate 20, and the pixel electrode 24 of each of the sub-pixel units 27 is used as a voltage to drive the movement of the charged microparticles in the electronic ink to perform a display operation.

In the above-mentioned embodiments, the description of each embodiment has its own emphasis. For parts that are not described in detail in one embodiment, reference may be made to related descriptions of other embodiments.

The above describes in detail the array substrate and the display panel provided by the embodiments of the present disclosure. Specific examples are used in the specification to illustrate the principles and implementations of the present disclosure. The descriptions of the above embodiments are only used to help understand the technical solutions and core concept thereof of the present disclosure. Those of ordinary skill in the art should understand that: they can still modify the technical solutions recited in the embodiments described above or equivalently replace some of the technical features; and these modifications or replacements do not cause an essence of the corresponding technical solutions to deviate from the scope of the technical solutions of the embodiments of the present disclosure.

What is claimed is:

1. An array substrate, comprising:
   scan lines;
   data lines intersecting the scan lines; and
   sub-pixel units defined by intersections of the scan lines and the data lines, wherein each of the sub-pixel units comprises a thin film transistor and a pixel electrode, and the thin film transistor comprises a gate connected to one of the scan lines, a source connected to one of the data lines, and a drain connected to the pixel electrode;
   wherein in a direction parallel to a plane of the array substrate, the source comprises two branch portions located in each of the sub-pixel units, the drain is connected to the pixel electrode through a connection hole, and the drain and the connection hole are disposed inside a range defined by the two branch portions;
   one connection portion extends from each of the data lines, and each of the data lines is connected to the two branch portions through the connection portions; and
   projections of the drain and the connection hole projected on the array substrate are located within a projection range of the gate projected on the array substrate; and
   endpoints of the two branch portions are connected to each other to form a closed ring shape, and the drain and the connection hole are disposed inside the ring shape.

2. The array substrate according to claim 1, wherein the drain and the connection hole are disposed at a center of the ring.

3. An array substrate, comprising:
   scan lines;
   data lines intersecting the scan lines; and
   sub-pixel units defined by intersections of the scan lines and the data lines, wherein each of the sub-pixel units comprises a thin film transistor and a pixel electrode, and the thin film transistor comprises a gate connected to one of the scan lines, a source connected to one of the data lines, and a drain connected to the pixel electrode;
   wherein in a direction parallel to a plane of the array substrate, the source comprises two branch portions located in each of the sub-pixel units, the drain is connected to the pixel electrode through a connection hole, and the drain and the connection hole are disposed inside a range defined by the two branch portions.

4. The array substrate according to claim 3, wherein one or more connection portions extends from each of the data lines, and each of the data lines is connected to the two branch portions through the one or more connection portions.

5. The array substrate according to claim 4, wherein endpoints the two branch portions extend in opposite directions to define a ring shape with a gap, and the drain and the connection hole are disposed within the gap of the ring shape.

6. The array substrate according to claim 5, wherein the drain is in a round shape or a rectangular shape.

7. The array substrate according to claim 4, wherein endpoints of the two branch portions are not connected to each other to from a semicircular arc shape with an opening, and the drain and the connection hole are disposed inside the opening of the semicircular arc shape.

8. The array substrate according to claim 3, wherein projections of the drain and the connection hole projected on the array substrate are located within a projection range of the gate projected on the array substrate.

9. The array substrate according to claim 3, wherein the gate is formed by a widened portion of the scan lines in the sub-pixel units.

10. The array substrate according to claim 3, wherein the thin film transistor further comprises an active layer, and in a direction perpendicular to the plane of the array substrate, the active layer is disposed on the gate, and the drain and the source are disposed on the active layer.

11. A display panel, comprising an array substrate, wherein the array substrate comprises:
   scan lines;
   data lines intersecting the scan lines; and
   sub-pixel units defined by intersections of the scan lines and the data lines,
   wherein each of the sub-pixel units comprises a thin film transistor and a pixel electrode, and the thin film transistor comprises a gate connected to one of the scan lines, a source connected to one of the data lines, and a drain connected to the pixel electrode; and
   wherein in a direction parallel to a plane of the array substrate, the source comprises two branch portions located in each of the sub-pixel units, the drain is connected to the pixel electrode through a connection hole, and the drain and the connection hole are disposed inside a range defined by the two branch portions.

12. The display panel according to claim 11, wherein one or more connection portions extend from each of the data lines, and each of the data lines is connected to the two branch portions through the one or more connection portions.

13. The display panel according to claim 12, wherein endpoints of the two branch portions are connected to each other to form a closed ring shape, and the drain and the connection hole are disposed inside the ring shape.

14. The display panel according to claim 13, wherein the drain and the connection hole are disposed at a center of the ring.

15. The display panel according to claim 13, wherein the drain is in a round shape, a rectangular shape, a trapezoidal ring, or a triangular ring.

16. The display panel according to claim 12, wherein endpoints of the two branch portions are not connected to each other to form a semicircular arc shape with an opening, and the drain and the connection hole are disposed inside the opening of the semicircular arc shape.

17. The display panel according to claim 11, wherein projections of the drain and the connection hole projected on the array substrate are located within a projection range of the gate projected on the array substrate.

18. The display panel according to claim 11, wherein the gate is formed by a widened portion of the scan lines in the sub-pixel units.

* * * * *